(12) United States Patent
Sugihara et al.

(10) Patent No.: US 7,123,345 B2
(45) Date of Patent: Oct. 17, 2006

(54) AUTOMATIC FOCUSING APPARATUS

(75) Inventors: Shinji Sugihara, Tokyo (JP); Riki Ogawa, Kawasaki (JP); Toru Tojo, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 10/897,120

(22) Filed: Jul. 23, 2004

(65) Prior Publication Data

US 2005/0052634 A1   Mar. 10, 2005

(30) Foreign Application Priority Data

Jul. 25, 2003   (JP)   ............................. 2003-279875

(51) Int. Cl.
*G03B 27/42*   (2006.01)
(52) U.S. Cl. ............................. 355/53; 355/67; 355/72; 378/34; 378/35; 250/492.2
(58) Field of Classification Search ..................... None
See application file for complete search history.

(56) References Cited

U.S. PATENT DOCUMENTS

| 4,698,513 | A |   | 10/1987 | Tojo et al. | ............... | 250/559.3 |
| 6,639,677 | B1 | * | 10/2003 | Ina et al. | ..................... | 356/401 |
| 6,714,281 | B1 | * | 3/2004 | Amano et al. | ................. | 355/55 |
| 2002/0048006 | A1 | * | 4/2002 | Mishima | ....................... | 355/53 |

FOREIGN PATENT DOCUMENTS

| JP | 5-297262 | 11/1993 |
| JP | 6-102011 | 4/1994 |
| JP | 2003-75122 | 3/2003 |

OTHER PUBLICATIONS

Ogawa et al.; "Method of Adjusting the Level of a Specimen Surface"; U.S. Appl. No. 10/666,241, filed Sep. 22, 2003.

\* cited by examiner

*Primary Examiner*—D. Rutledge
(74) *Attorney, Agent, or Firm*—Finnegan, Henderson, Farabow, Garrett & Dunner, L.L.P.

(57) ABSTRACT

An automatic focusing apparatus comprises a stage holding a substrate, an objective lens disposed facing the substrate surface, an illumination optics illuminating the substrate surface with a spotted light beam from an oblique direction, a photodetector detecting reflected light from the substrate surface, a position detection circuit detecting a vertical position of the substrate surface from an electric signal obtained from the photodetector to output a position signal, a correction circuit monitoring the position signal in real time and subtracting a surplus exceeding a signal change corresponding to a surface shape change of the substrate from the position signal, when a change amount per unit time of the position signal exceeds a predetermined level and outputting a corrected position signal, and a stage control circuit controlling the vertical position of the stage based on the corrected position signal.

20 Claims, 7 Drawing Sheets

Without astigmatism

With astigmatism
Focus shift in + direction
y: Line direction

AUTOMATIC FOCUSING APPARATUS

CROSS-REFERENCE TO RELATED APPLICATIONS

This application is based upon and claims the benefit of priority from prior Japanese Patent Application No. 2003-279875, filed Jul. 25, 2003, the entire contents of which are incorporated herein by reference.

BACKGROUND OF THE INVENTION

1. Field of the Invention

The present invention relates to an automatic focusing apparatus for use in a semiconductor lithography system, a semiconductor inspection system and the like, and particularly to an automatic focusing apparatus for focusing an objective lens on the surface of substrates to be inspected, such as a semiconductor substrate or a glass substrate.

2. Description of the Related Art

A resolution which is equal to or less than a circuit pattern size is required in optical systems such as a lithography system which transfers a circuit pattern onto a semiconductor substrate, and a defect inspection system which inspects a pattern of a semiconductor integrated circuit. In an optical apparatus in which a light source in a range of visible light to ultraviolet light is used, in order to increase the resolution, in general, it is necessary to shorten a light source wavelength or to increase a lens numerical aperture (N/A). However, since a depth of focus of the optical system is proportional to the light source wavelength, and is inversely proportional to a square of NA, a short-wavelength/high-NA optical system has a problem that the depth of focus is small. Therefore, an automatic focusing apparatus is indispensable which keeps a distance between substrates to be inspected such as a semiconductor substrate and an objective lens to be constant, and enhancement of precision of the automatic focusing apparatus is required.

As a conventional automatic focusing apparatus, there is an oblique light incident method disclosed, for example, in Jpn. Pat. Appln. KOKAI Publication No. 6-102011. In this method, the surface of the substrate is irradiated with light from an oblique direction, a reflected light from the substrate is detected by a photosensor, and a detection output of the photosensor is converted to positional deviation information of a vertical direction to measure a vertical position. Moreover, when a measurement signal is fed back to a control circuit of a stage, a relative distance between the substrate and a main optical system can be maintained with high precision.

Moreover, as another method, there is a double pinhole method described in Jpn. Pat. Appln. KOKAI Publication No. 5-297262. In this method, the light reflected by the surface of the substrate is converged by a lens, and is also branched into two light paths by a beam splitter, a pinhole and a photosensor are disposed before a focal point of the lens in a first light path, the pinhole and photosensor are disposed after the focal point of the lens in a second light path, and an electric difference/sum of signals obtained by the two photosensors is calculated. Accordingly, the position of the substrate surface in the vertical direction can be measured.

However, in this type of automatic focusing apparatus, there is a possibility that the following problem is generated. That is, when the vertical position of the surface of the substrate is detected while moving a stage including a substrate laid on the stage in a horizontal direction, a steep change exceeding a change of an original surface shape of the substrate is caused.

With respect to this problem, the present inventors have found that a phenomenon in which a reflection spot position of reflected light shifts with respect to a fine pattern having a line width of the same degree as that of a light source wavelength, when an incident angle θ between a pattern surface and incidence light exceeds a certain value. This is caused by resonance, which occurs when a spatial period of a pattern and an incident angle and a wavelength satisfy a specific relation. The shifting of the reflection spot is regarded as movement of a focal position in a photosensor plane. Therefore, an output of a position detection circuit changes in proportion to a movement amount of a spot position, and a large error is made when the vertical position of the substrate surface is measured.

When a light beam is incident upon a fine pattern on the substrate having the same degree of line width as that of the light source wavelength in the conventional automatic focusing apparatus in this manner, the spot position of the reflected light changes, and accordingly there has been a problem that a measurement error is generated.

Therefore, there has been a demand for realization of an automatic focusing apparatus capable of suppressing the measurement error caused by the spot position change of the reflected light and capable of enhancing reliability of focusing, when the light beam is incident upon the fine pattern having the same degree of line width as that of the light source wavelength of the substrate.

BRIEF SUMMARY OF THE INVENTION

According to a first aspect of the invention, there is provided an automatic focusing apparatus which comprises:

a stage which holds a substrate and which is movable in a horizontal direction and a vertical direction;

an objective lens disposed facing a surface of the substrate;

a first illumination optics which illuminates the surface of the substrate with at least one spotted light beam from an oblique direction;

a first photodetector which detects reflected light from the surface of the substrate to output a first electrical signal;

a first position detection circuit which detects a vertical position of the surface of the substrate from the first electric signal to output a first position detection signal;

a correction circuit which monitors the first position detection signal in real time and which subtracts a surplus exceeding a signal change corresponding to a surface shape change of the substrate from the first position detection signal, when a change amount per unit time of the first position detection signal exceeds a first predetermined level, to output a corrected position signal; and a stage control circuit which controls the vertical position of the stage based on the corrected position signal.

According to a second aspect of the invention, there is provided an automatic focusing apparatus which comprises:

a stage which holds a substrate and which is movable in a horizontal direction and a vertical direction;

an objective lens disposed facing the surface of the substrate;

an illumination optics which illuminates the surface of the substrate with a plurality of spotted light beams from an oblique direction at different incident angles or in different incident directions;

a plurality of photodetectors which detect a plurality of reflected lights from the surface of the substrate to output electric signals;

a position detection circuit which selects an electric signal having a minimum signal change amount from the electric signals to detect a vertical position of the surface of the substrate to output a position signal; and a stage control circuit which controls the vertical position of the stage based on the position signal.

According to a third aspect of the invention, there is provided an automatic focusing apparatus which comprises:

a stage which holds a substrate and which is movable in a horizontal direction and a vertical direction;

an objective lens disposed facing the surface of the substrate;

an illumination optics which illuminates the surface of the substrate with a spotted light beam from an oblique direction;

a wave plate which is disposed in the illumination optics to obtain a circular polarization of the light beam incident upon the surface of the substrate from the oblique direction;

a beam splitter which branches the reflected light from the surface of the substrate into two reflected beams in two directions;

a first polarizing beam splitter which branches one of the two reflected beams into a first and a second light beam whose polarization directions cross each other at a right angle;

a second polarizing beam splitter which branches the other of the two reflected beams into a third and a fourth light beam whose polarization directions cross each other at the right angle and whose polarization directions are different from those of the first and the second light beam by 45 degrees;

a first photodetector which detects the first light beam to output a first electric signal;

a second photodetector which detects the second light beam to output a second electric signal;

a third photodetector which detects the third light beam to output a third electric signal;

a fourth photodetector which detects the fourth light beam to output a fourth electric signal;

a position detection circuit which receives the first to the fourth electric signal and which selects an electric signal having a minimum change amount to detect a vertical position of the surface of the substrate and output a position signal; and a stage control circuit which controls the vertical position of the stage based on the position signal.

According to a fourth aspect of the invention, there is provided an automatic focusing apparatus which comprises:

a stage which holds a substrate and which is movable in a horizontal direction and a vertical direction;

an objective lens disposed facing the surface of the substrate;

an illumination optics which faces the substrate via the objective lens;

a first beam splitter which transmits a light beam emitted from the illumination optics to irradiate the surface of the substrate with a spotted light beam and receives a reflected light beam from the substrate to emit the reflected light beam out by reflection;

a condensing optics which converges the reflected light beam emitted from the first beam splitter to output a converged beam;

a second beam splitter which branches the converged beam into a first and a second branched light in two directions;

a first area sensor which is disposed on a light path of the first branched light and before a focal position of the condensing optics to detect the first branched light and output a first electric signal;

a second area sensor which is disposed on a light path of the second branched light and behind the focal position of the condensing optics to detect the second branched light and output a second electric signal;

a position detection circuit which processes the first and the second electric signal to detect a vertical position of the substrate and output a position signal; and a stage control circuit which controls the vertical position of the stage based on the position signal.

DETAILED DESCRIPTION OF THE INVENTION

Figure 1:
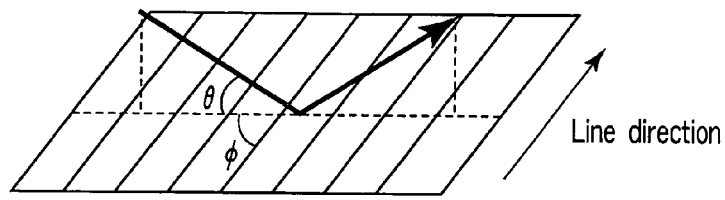
FIG. 1 is a schematic diagram which defines an incident direction $\phi$ and an incident angle $\theta$ in a pattern plane in which wirings are formed.
Figure 2:
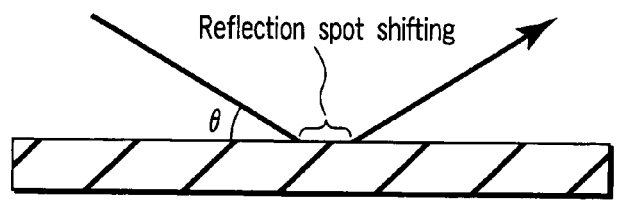
FIG. 2 is a schematic diagram showing shifting of a reflected light spot position, caused in an the incident angle $\theta$.

Prior to description of embodiments, problems of a conventional automatic focusing apparatus will be described. The present inventors have observed a phenomenon in which a reflection spot position of reflected light shifts as shown in FIG. 2, when an incident angle θ between a pattern plane and incident light exceeds a certain value with respect to a fine pattern having the same degree as that of a light source wavelength as shown in FIG. 1. This is caused by resonance which occurs when a spatial period of the pattern and the incident angle and the wavelength satisfy a specific relation. The shifting of the reflection spot is regarded as movement of a focal position in a photosensor plane. Therefore, an output of a signal processing circuit changes in proportion to a movement amount of the spot position, and a large error is made when a vertical position of the substrate is measured.

According to the embodiments described hereinafter, a correction circuit is disposed which detects a steep change of a reflection spot position detection signal with the shifting of the reflection spot to correct an excessive change exceeding a signal change value corresponding to a surface shape change of the substrate. Alternatively, a plurality of photodetectors are disposed, and a photodetector having a minimum change of the spot position of the reflected light is selected. Accordingly, when a light beam is incident upon the fine pattern on the substrate having the same degree of line width as that of the light source wavelength, a measurement error caused by the spot position change of the reflected light can be suppressed. Accordingly, it is possible to enhance reliability of measurement, and reliability in a semiconductor lithography system or a semiconductor inspection system can be enhanced.

The embodiments of the present invention will be described hereinafter with reference to the drawings.

(First Embodiment)

In a case where a change of a vertical position of a substrate to be inspected or a vibration period of a stage onto which the substrate is to be mounted are moderate, the vertical position change of the substrate surface is a physical deviation, and therefore a frequency of a signal change relating to the deviation is generally low. On the other hand, the frequency of the signal change caused by the spot shifting of reflected light is high as compared with vertical position fluctuation of the substrate, and the change is steep. Therefore, when a high frequency component or a steep signal change is detected, generation of a signal error by the reflected light spot shifting can be detected. Moreover, precise focal position settlement can be achieved by removing the signal error component.

Figure 3:
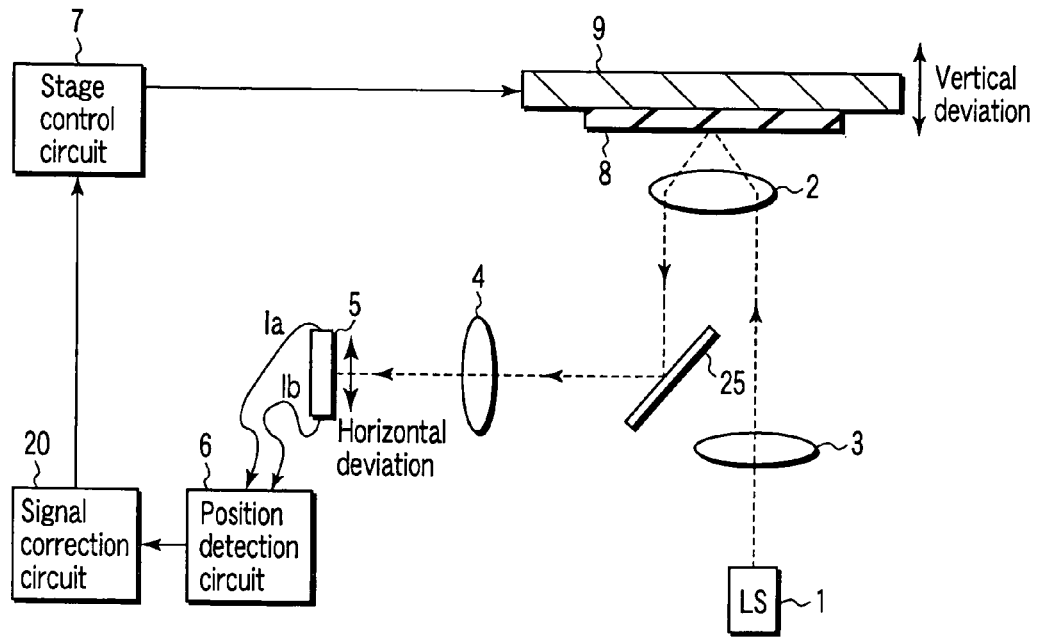
FIG. 3 is a schematic diagram of an automatic focusing apparatus according to a first embodiment.

FIG. 3 is a schematic diagram of an automatic focusing apparatus according to a first embodiment of the present invention based on this concept. This apparatus is applied to a pattern inspection system for inspecting a pattern on a substrate, and includes a position detecting mechanism which measures a relative distance on the substrate surface and a stage control mechanism in which the substrate is disposed to control the position of the substrate.

The stage control mechanism comprises a stage 9 on which a substrate 8 is mounted, and a stage control circuit 7. The stage control circuit 7 forms a closed loop based on a position signal obtained in a position detection circuit 6 described later, and controls the stage 9 to keep a distance between the surface of the substrate 8 and an objective lens 2 to be constant. The stage 9 allows the position of the substrate 8 to deviate in a vertical direction (Z-direction) by a piezoelectric device and the like, following the control of the stage control circuit 7. The stage 9 is movable in a horizontal direction (XY-direction) in order to inspect the whole surface of the substrate 8.

The position detecting mechanism comprises a light source 1, objective lens 2, lens 3, mirror 25, lens 4, photo-sensor (photodetector) 5, position detection circuit 6, signal correction circuit 20 and the like. A light beam radiated from the light source 1 is obliquely incident upon a pattern plane on a surface of the substrate 8 via the lens 3 and objective lens 2 to form a spotted light source image. For example, a laser diode is used in the light source 1. The reflected light from the substrate 8 is formed into an image on the photosensor 5 via the objective lens 2, mirror 25, and lens 4. An output signal from the photosensor 5 is input into the position detection circuit 6, an error of the position signal output from the circuit 6 is corrected in the signal correction circuit 20, and a corrected position signal is input into the stage control circuit 7.

The position detection circuit 6 detects the position of the pattern plane in an axial direction vertical to the substrate pattern plane based on the output signal from the photosensor 5. It is to be noted that in the present embodiment, a line sensor is used as the photosensor 5, and a vertical deviation of the substrate pattern plane is converted to a horizontal deviation on the line sensor, but a quadrature photodiode may also be used to obtain the similar conversion. The position detection circuit 6 may also be constituted integrally with the signal correction circuit 20.

The photosensor 5 outputs two signals Ia, Ib dependent on a light amount distribution of a light receiving surface. In FIG. 3, the output state is schematically shown. In the signal correction circuit 20, after filtering a signal noise, calculation of (Ia−Ib)/(Ia+Ib) is performed by an adding circuit, a subtracting circuit, and a dividing circuit. A difference (Ia−Ib) is a value proportional to the coordinates of the centroid of the incident light beam, and depends on a light quantity of the light beam. Therefore, the value is divided by a sum (Ia+Ib) to perform normalization. This forms a position detection signal indicating the vertical position of the surface of the substrate 8.

The signal correction circuit 20 corrects the position detection signal obtained by the position detection circuit 6. An average settling time from when the deviation of the substrate 8 is input into the stage control circuit 7 until the stage 9 responds is longer than a signal change period with the abnormal deviation of the spot position. Therefore, the stage 9 does not quickly respond for a certain time from when the abnormal deviation of the spot position of the reflected light occurs, and therefore a steep change appears in the position detection signal. This steep signal change is larger than a change of the position detection signal corresponding to the vertical deviation of the substrate 8 or the surface shape of the substrate 8. Therefore, when the steep change of the position detection signal is observed (it is detected that a change amount per unit time exceeds a predetermined level), the abnormal deviation of the reflected light spot position can be detected.

The signal correction circuit 20 monitors a difference between the position detection signal and a vertical position target value (feedback target value), and detects abnormality in a case where the difference exceeds a predetermined threshold value assuming the surface shape of the substrate 8. Moreover, upon detecting the abnormality, the signal correction circuit 20 outputs the corrected position signal obtained by correcting the abnormal deviation of the signal based on a predetermined algorithm.

More concretely, in the present embodiment, the following algorithm is used. The vertical position target value is output regardless of the position detection signal for a certain time after detecting the abnormality. After a change ratio of the position detection signal is reduced to fall within the predetermined value, the difference between the position detection signal and the vertical position target value at this time is calculated as an offset. Thereafter, when the calculated offset value is subtracted from the vertical position target value, only the component of the abnormal deviation can be removed. As another algorithm, various means can be used such as a method in which differentiating calculation of the position detection signal is performed, and the vertical position target value is output in a case where a predetermined threshold value is exceeded.

In this manner, according to the present embodiment, the signal correction circuit 20 is disposed which detects the steep change of the position detection signal to correct a surplus exceeding the value corresponding to the surface shape of the substrate 8. Accordingly, when the light beam is incident upon the fine pattern on the substrate 8, having the same degree of line width as that of a light source wavelength, the measurement error caused by the spot position change of the reflected light can be suppressed. That is, an influence of the abnormal deviation of the reflected light spot caused with a pattern size which is less than the light source wavelength is suppressed, and the focusing can be performed with high reliability.

(Second Embodiment)

Figure 4:
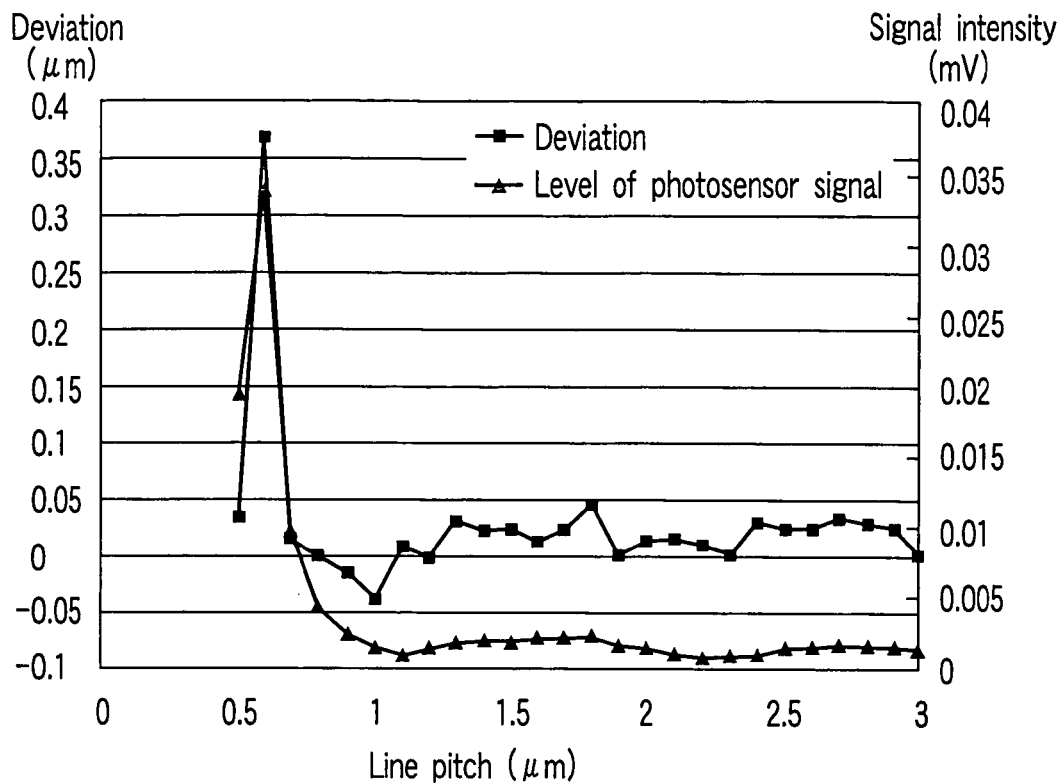
FIG. 4 is a characteristic diagram showing a correlation between abnormal deviation and photosensor signal level with spot positional deviation.

The present inventors have found that there is a correlation between the spot position abnormal deviation of the reflected light and a polarization state of the reflected light. FIG. 4 shows a correlation between a signal intensity of a photosensor to measure the polarization state of the reflected light, and a spot positional deviation. As shown in FIG. 2, the polarization state of the reflected light at a time when the abnormal deviation of the spot position occurs collapses as compared with a usual state. Therefore, when the polarization state of the reflected light is measured, and the change of the polarization state and the steep signal change are simultaneously detected, judgment is performed to perform correction, and accordingly the possibility that the correction is wrongly performed can be reduced. The degree of accuracy of correction can be enhanced by measuring the polarization state of the reflected light in this manner.

Figure 5:
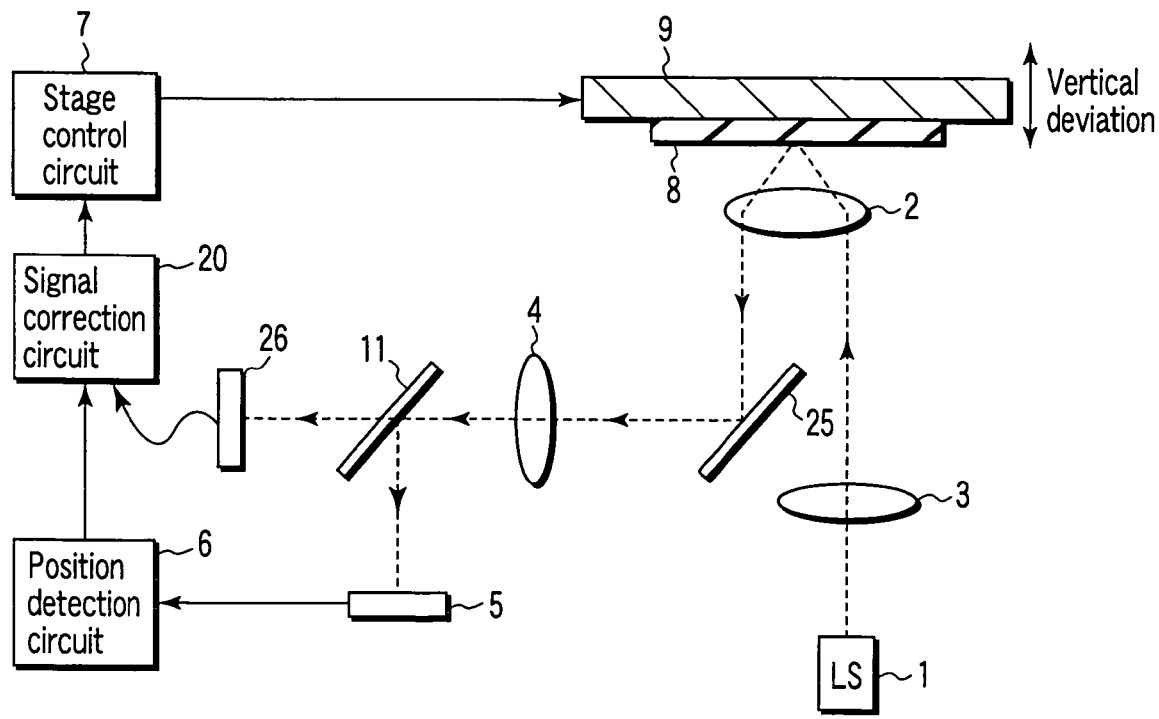
FIG. 5 is a schematic diagram of the automatic focusing apparatus according to a second embodiment.

FIG. 5 is a schematic diagram showing the automatic focusing apparatus according to a second embodiment of the present invention based on this concept. It is to be noted that the same parts as those of FIG. 3 are denoted with the same reference numerals, and a detailed description is omitted.

A stage control mechanism comprises a stage control circuit 7 and a stage 9 in the same manner as in the first embodiment. In a position detecting mechanism, in addition to the configuration of the first embodiment, a beam splitter 11 and a polarization detecting mechanism 26 are disposed.

A light beam radiated from a light source 1 is obliquely incident upon a pattern plane of a substrate 8 via a lens 3 and objective lens 2 to form a spotted light source image. The reflected light from the substrate 8 is formed into an image on a photosensor 5 via the objective lens 2, mirror 25, lens 4, and beam splitter 11.

Here, the reflected light beam is branched into two by the beam splitter 11 before incident upon the photosensor 5, and one branched light beam is incident upon the polarization detecting mechanism 26. The polarization detecting mechanism 26 is not limited as long as a polarization component of a predetermined direction can be detected, and may be comprised of, for example, a polarization plate and photosensor. The polarization detecting mechanism 26 transmits the signal to a signal correction circuit 20 only when the polarization occurs.

An output signal from the photosensor 5 is changed to a position detection signal by a position detection circuit 6, an error component is removed by the signal correction circuit 20, and the signal is input into the stage control circuit 7 in the same manner as in the first embodiment. In FIG. 5, to avoid complicated drawings, the output of the photosensor 5 is represented by one line, but when the line sensor similar to one in the first embodiment is used, the configuration becomes similar to FIG. 3. Also in the following embodiments, the output of the photosensor 5 is represented by one line.

The signal correction circuit 20 corrects the position detection signal obtained by the position detection circuit 6. The signal correction circuit 20 monitors a difference between the position detection signal and a vertical position target value, and detects abnormality when the difference exceeds a predetermined threshold value assuming the surface shape of the substrate 8 and a polarization information signal input from the polarization detecting mechanism 26 is out of an allowable range. Upon detecting the abnormality, the signal correction circuit 20 outputs a vertical position signal whose abnormal deviation has been corrected based on a predetermined algorithm. A concrete correction algorithm may be similar to that of the first embodiment. It is to be noted that when the abnormality can be securely detected only with the polarization information signal obtained by the polarization detecting mechanism 26, the difference between the position detection signal and the vertical position target value does not have to be monitored.

As described above, according to the present embodiment, in addition to the signal correction circuit 20 which detects the steep change of the position detection signal to correct the surplus exceeding the value corresponding to the surface shape of the substrate, the polarization detecting mechanism 26 which detects the change of the polarization state with the abnormal deviation of the spot position is disposed. Accordingly, needless to say, an advantage similar to that of the first embodiment can be obtained, the abnormality can be detected more securely, and higher reliability focusing can be performed.

(Third Embodiment)

The present inventors have devised a method of installing a back surface photosensor which measures the vertical deviation of the back surface of the substrate separately from a front surface photosensor which measures the vertical position of the surface of the substrate. When the vertical position of the substrate deviates, the same deviation signal is observed both in the front and back surface photosensors. When an abnormal deviation is caused in a reflected light position measured by the front surface photosensor, the front surface photosensor observes the deviation, but the back surface photosensor does not observe the deviation. Therefore, when the measured value of the front surface photosensor is constantly compared with that of the back surface photosensor, the front surface photosensor detects an abnormal change, and the back surface photosensor does not detect any abnormality, correction is performed to remove an abnormal signal from the signal of the front surface photosensor, accordingly a possibility of a wrong operation is suppressed, and accuracy of the correction can be enhanced.

Figure 6:
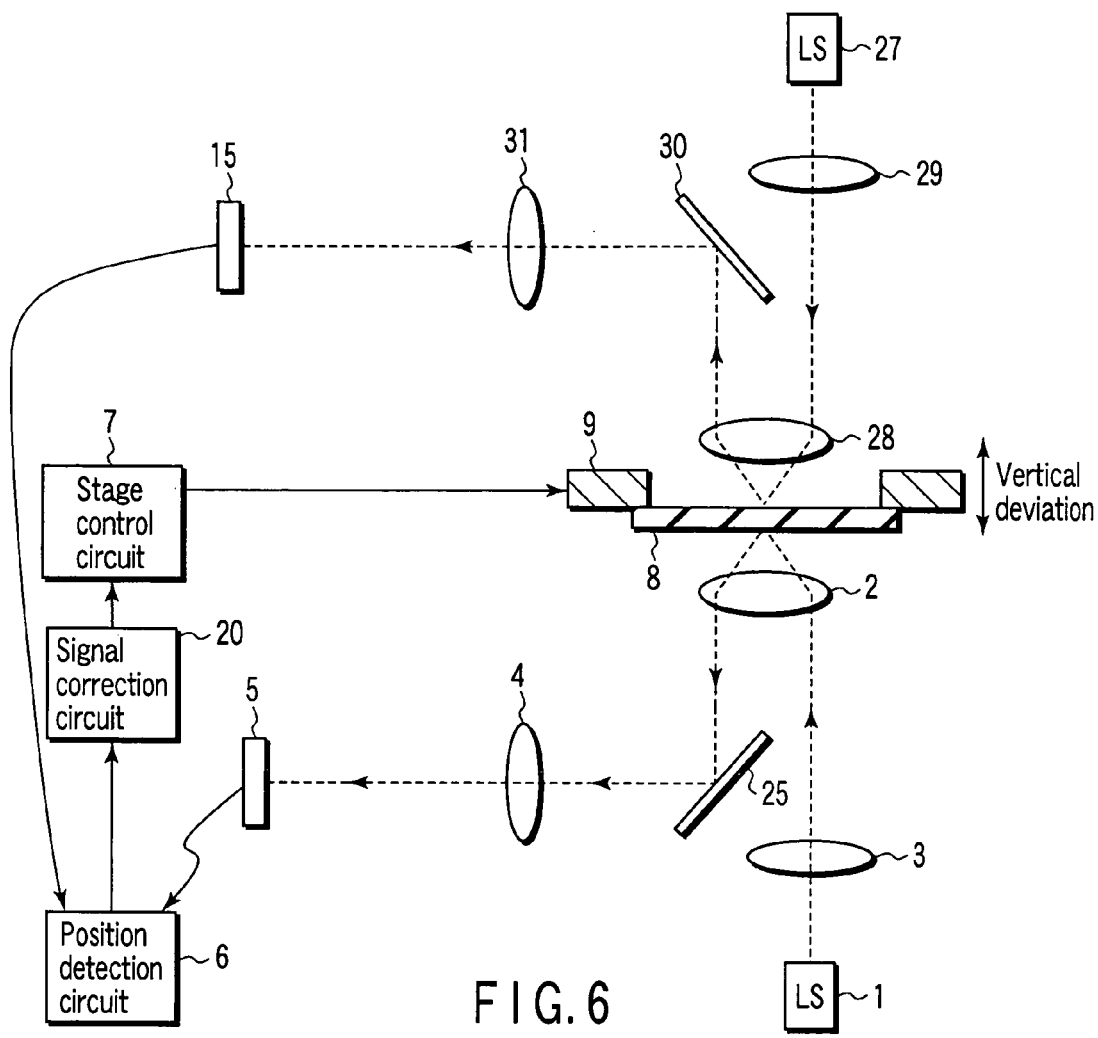
FIG. 6 is a schematic diagram of the automatic focusing apparatus according to a third embodiment.

FIG. 6 is a schematic diagram of the automatic focusing apparatus according to a third embodiment of the present invention based on this concept. It is to be noted that the same parts as those of FIG. 3 are denoted with the same reference numerals, and the detailed description is omitted.

A stage control mechanism comprises a stage control circuit 7 and a stage 9 in the same manner as in the first embodiment. A position detecting mechanism comprises two systems which measure the vertical positions of a pattern surface (front surface) and the back surface of a substrate 8. In two systems of the present embodiment, the detecting mechanism of the pattern surface is the same as that of the back surface, but a separate detection method may also be used. The position detecting mechanism on a front-surface side is similar to that of the first embodiment. The position detecting mechanism on a back-surface side comprises a light source 27, objective lens 28, lens 29, mirror 30, lens 31, and photosensor 15. Signals from photosensors 5, 15 are simultaneously input into a position detection circuit 6, and position detection signals are obtained.

A signal correction circuit 20 corrects the position detection signal obtained by the position detection circuit 6. The signal correction circuit 20 monitors a difference between the position detection signal by the photosensor 5 of the front surface, and a vertical position target value, and detects abnormality of a front surface photosensor signal in a case where the difference exceeds a predetermined threshold value assuming the surface shape of the substrate 8. Moreover, the vertical position measured value of the front surface photosensor 5 is constantly compared with that of the back surface photosensor 15, and the abnormality is detected only in a case where the signal change obtained by the front surface photosensor 5 is not detected by the back surface photosensor 15. When the photosensor signal is abnormal, the signal correction circuit 20 outputs the corrected position signal obtained by correcting the abnormal deviation of the signal based on a predetermined algorithm. A concrete correction algorithm may be similar to that of the first embodiment. It is to be noted that when the abnormality can be securely detected only by the difference between the position detection signals of the photosensors 5, 15, the difference between the position detection signal and the feedback target value does not have to be monitored.

As described above, according to the present embodiment, the signal correction circuit 20 which detects the steep change of the position detection signal to correct the surplus exceeding the value corresponding to the surface shape of the substrate is disposed, and additionally the opposite surfaces of the substrate 8 are measured and compared. Accordingly, detection precision of the abnormal deviation of the reflected light spot can be raised. As a result, reliability of correction can be enhanced.

(Fourth Embodiment)

The present inventors have devised a method in which a wave plate and a polarizing beam splitter are used as means for measuring a polarization state of reflected light from a substrate as described in the second embodiment. The wave plate is adjusted in such a manner that the polarization state of the light reflected by the substrate 8 and incident upon the photosensor (first photosensor) 5 indicates substantially linear polarization in a state in which the substrate does not have any pattern. Therefore, the light is usually non-incident upon a photosensor (second photosensor) included in the polarization detecting mechanism 26 in FIG. 5.

When the polarization state of the reflected light collapses in this state, the amount of light incident upon the second photosensor increases. Therefore, when the intensity of the light incident upon the second photosensor is measured, the polarization state of the reflected light can be measured in real time. Therefore, when the signal of the second photosensor is input into a position detection circuit 20, and the signal of the second photosensor exceeds a threshold value in a signal correction circuit 20, a steep change exceeding a signal change by a concave/convex portion of the substrate 8 is corrected. As a result, the possibility that the correction is excessively performed can be largely suppressed, and the abnormal deviation of the reflected light spot position can be corrected with high reliability.

Figure 7:
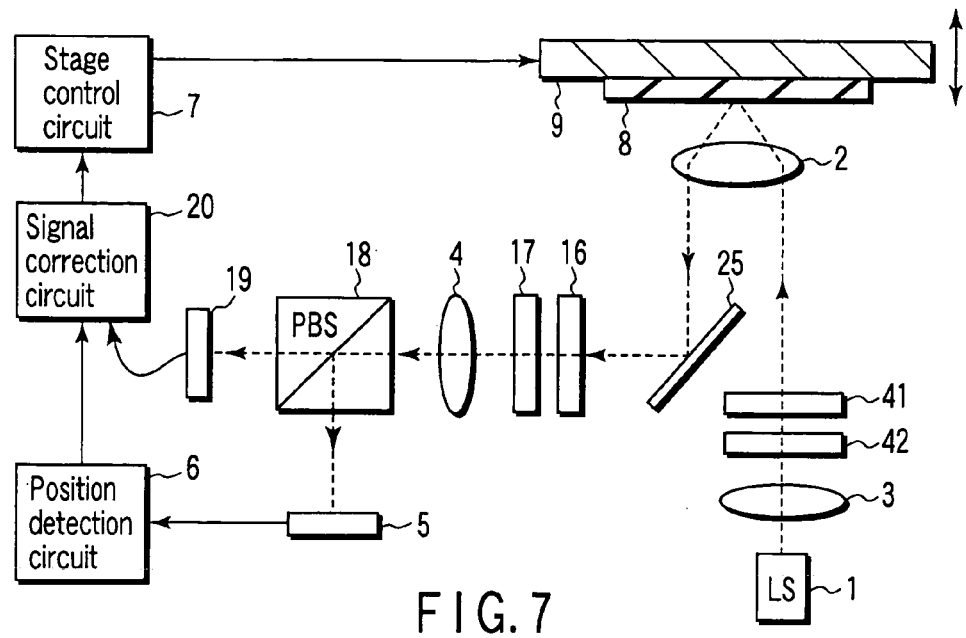
FIG. 7 is a schematic diagram of the automatic focusing apparatus according to a fourth embodiment.

FIG. 7 is a schematic diagram of the automatic focusing apparatus according to a fourth embodiment of the present invention based on this concept. It is to be noted that the same parts as those of FIG. 3 are denoted with the same reference numerals, and a detailed description is omitted.

A stage control mechanism comprises a stage control circuit 7 and a stage 9 in the same manner as in the first embodiment. In addition to the configuration of the second embodiment, a position detecting mechanism comprises wave plates 41, 42, wave plates 16, 17, a polarizing beam splitter 18, and a second photosensor 19.

A light beam radiated from a light source 1 is obliquely incident upon a pattern plane of a substrate via a lens 3, the wave plates 41, 42, and an objective lens 2 to form a spotted light source image. Each of the wave plates 41, 42 comprises a $\lambda/2$ (half-wave) plate, $\lambda/4$ (quarter-wave) plate, and is adjusted in such a manner that the polarization state during incidence upon a substrate 8 indicates a substantially circular polarization. The reflected light from the substrate 8 is formed into images on a first photosensor 5 and the second photosensor 19 via the objective lens 2, mirror 25, wave plates 16, 17, lens 4, and polarizing beam splitter 18. Each of the wave plates 16, 17 comprises the $\lambda/2$ plate and $\lambda/4$ plate, and is adjusted in such a manner that the polarization state at a time when there is no pattern in the surface of the substrate 8 indicates a substantially linear polarization. The polarizing beam splitter 18 is disposed in such a manner that the amount of light of the first photosensor 5 is maximized when there is no pattern in the surface of the substrate 8.

In this configuration, the light beam branched by the polarizing beam splitter 18 is incident upon the second photosensor 19 only in a case where the usual polarization state of reflected light changes. An output signal from the first photosensor 5 is input into a position detection circuit 6, and the circuit 6 outputs a position detection signal to a signal correction circuit 20.

The signal correction circuit 20 corrects the position detection signal obtained by the position detection circuit 6. The signal correction circuit 20 monitors a difference between the position detection signal and a vertical position target value, and detects abnormality when the difference exceeds a predetermined threshold value, assuming the surface shape of the substrate and a signal obtained from the second photosensor 19 is outside an allowable range. Upon detecting the abnormality, the signal correction circuit 20 corrects an error component of the position signal based on a predetermined algorithm to output a position detection signal to the stage control circuit 7. A concrete correction algorithm may be similar to that of the first embodiment. It is to be noted that when the abnormality can be securely detected only by the signal obtained by the second photosensor 19, the difference between the position detection signal and the vertical position target value does not have to be monitored.

As described above, according to the present embodiment, in addition to the signal correction circuit 20 which detects the steep change of the position detection signal to correct the surplus exceeding the value corresponding to the surface shape of the substrate, the second photosensor 19 is disposed which detects the polarization change with the abnormal deviation of the spot position. Accordingly, an advantage similar to that of the second embodiment can be obtained.

(Fifth Embodiment)

Figure 8:
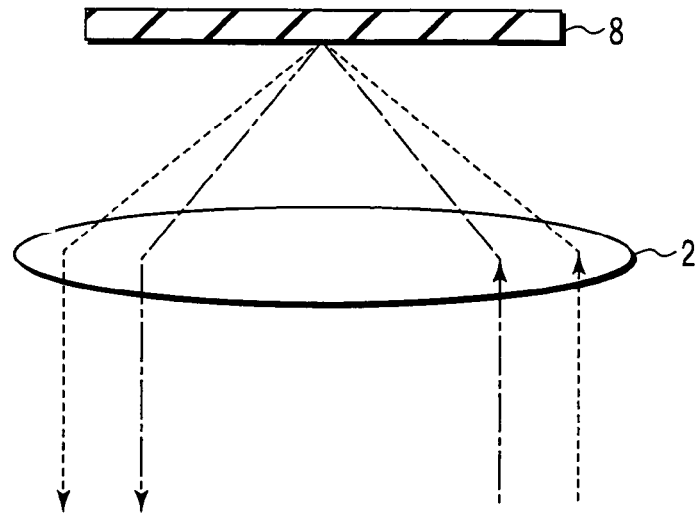
FIG. 8 is a schematic diagram showing that light is applied to a substrate surface at different incident angles.

An abnormal deviation of a spot position of reflected light from a substrate also depends on an incident angle of incident light. Therefore, light beams are incident upon a substrate 8 from a plurality of angles as shown in FIG. 8, optical paths and photosensors are disposed for the respective light beams, and accordingly a signal can be obtained in which an influence of a pattern on the substrate 8 is minimized. A height deviation of the substrate 8 is equally reflected in the signals of the photosensors for the respective light beams. Therefore, when a signal having the least signal change in the photosensor is selected, the influence of the abnormal deviation of the reflected light spot position can be suppressed.

Figure 9:
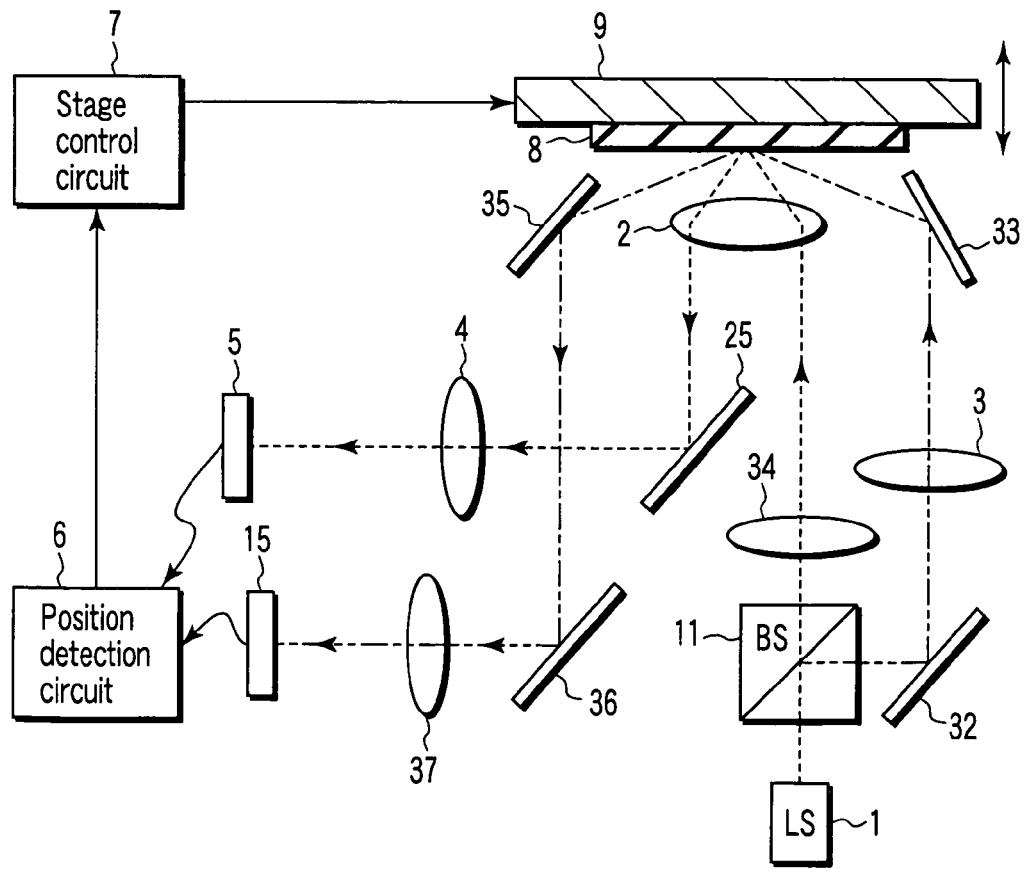
FIG. 9 is a schematic diagram of the automatic focusing apparatus according to a fifth embodiment.

FIG. 9 is a schematic diagram of the automatic focusing apparatus according to a fifth embodiment of the present invention based on this concept. It is to be noted that the same parts as those of FIG. 3 are denoted with the same reference numerals, and a detailed description is omitted.

A stage control mechanism comprises a stage control circuit 7 and a stage 9 in the same manner as in the first embodiment. As a position detecting mechanism, two systems having different incident angles are disposed. That is, the position detecting mechanism comprises a light source 1, a beam splitter 11, mirrors 32, 33, lenses 3, 34, an objective lens 2, mirrors 25, 35, 36, lenses 4, 37, photosensors 5, 15, and a position detection circuit 6.

A light beam radiated from the light source 1 is branched by the beam splitter 11, one branched light beam is obliquely incident upon the pattern surface of the substrate 8 through the lens 34 and objective lens 2, the other branched light beam is obliquely incident upon the pattern surface of the substrate 8 through the mirror 32, lens 3, and mirror 33, and spotted light source images are formed. The incident angles of the respective light beams upon the substrate 8 are set to be different from one another as shown in FIG. 8.

In the present embodiment, one of the branched light beams is incident upon the substrate from the outside of the objective lens 2, but may take a light path passing through the objective lens 2. The reflected light from the substrate 8 is formed into an image on the photosensor 5 via the objective lens 2, mirror 25, and lens 4 or on the photosensor 15 via the mirrors 35, 36 and lens 37. Output signals from the photosensors 5, 15 are simultaneously input into the position detection circuit 6, and the circuit 6 outputs a position signal to the stage control circuit 7.

The position detection circuit 6 detects the position based on the detection signals of the sensors 5, 15, and further has a selection function of selecting either position detection signal. More concretely, the position is detected based on the signals obtained by the photosensors 5, 15, and a position detection signal which changes less with time is selected, or a signal having less signal change is selected from the signals obtained by the photosensors 5, 15 to detect the position.

Next, the position detection circuit 6 selects the position signal obtained from the photosensors 5, 15. In the position detection circuit 6, a signal having a minimum change amount is selected from the input signals from the photosensors 5, 15, and output to the stage control circuit 7. Accordingly, the signal change by the abnormal deviation of the reflected light beam spot position is removed, and an automatic focusing operation can be normally performed.

As described above, according to the present embodiment, a plurality of position detecting mechanisms having different incident angles are disposed, and the detection signal of a sensor having a minimum spot position change of reflected light is selected. Accordingly, a measurement error caused by the spot position change of reflected light can be suppressed in a case where the light beam is incident upon a fine pattern on the substrate 8, having the same degree of line width as that of the light source wavelength. Therefore, an advantage similar to that of the first embodiment can be obtained.

It is to be noted that as described above, with respect to the fine pattern having the same degree of line width as that of the line sensor wavelength, when an incident angle θ between the pattern surface and the incident light exceeds a certain value as shown in FIG. 1, the shifting of the reflection spot position of the reflected light is observed as shown in FIG. 2. This is caused by resonance which occurs when the spatial period of the pattern and the incident angle and the wavelength satisfy a specific relation. Therefore, it is easily understood that when the incident angle is changed as in the present embodiment, the influence on the sensor differs. That is, the selection of the detection signal of the sensor having a minimum spot position change of reflected light means the selection of a sensor output in which no resonance is caused, and accordingly high-precision focusing is possible.

(Sixth Embodiment)

Figure 10:
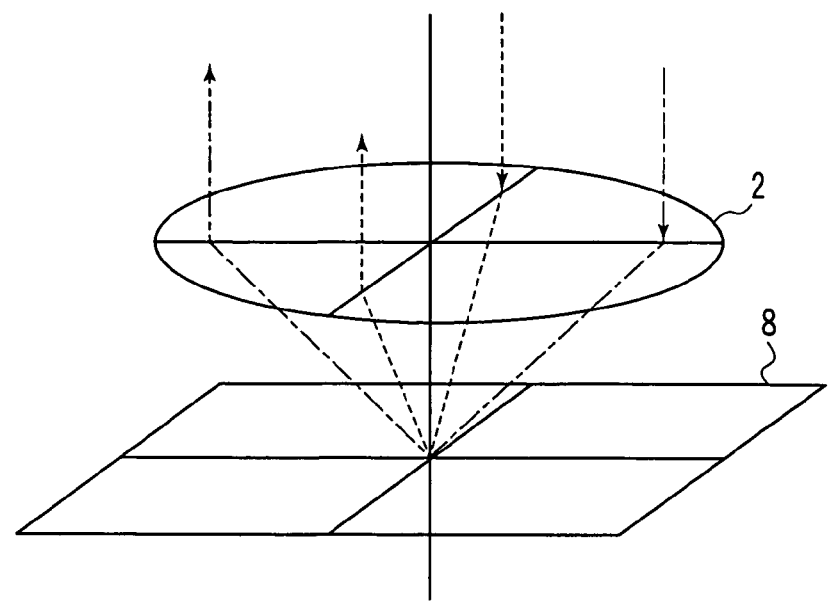
FIG. 10 is a schematic diagram showing that light is applied to the substrate surface in different incident directions.

An abnormal deviation of a spot position of reflected light from a substrate surface depends on the direction of incident light with respect to the direction of a pattern on a substrate. Therefore, light beams are incident upon a substrate 8 from a plurality of directions as shown in FIG. 10, photosensors are disposed for the respective light beams, and accordingly a signal can be obtained in which the influence of a pattern on the substrate 8 is minimized. A vertical position deviation of the substrate 8 is equally reflected in the signals of the photosensors for the respective light beams. Therefore, when a signal having a minimum signal change in the photosensor is selected, the influence of the abnormal deviation of the reflected light spot position can be suppressed.

Figure 11:
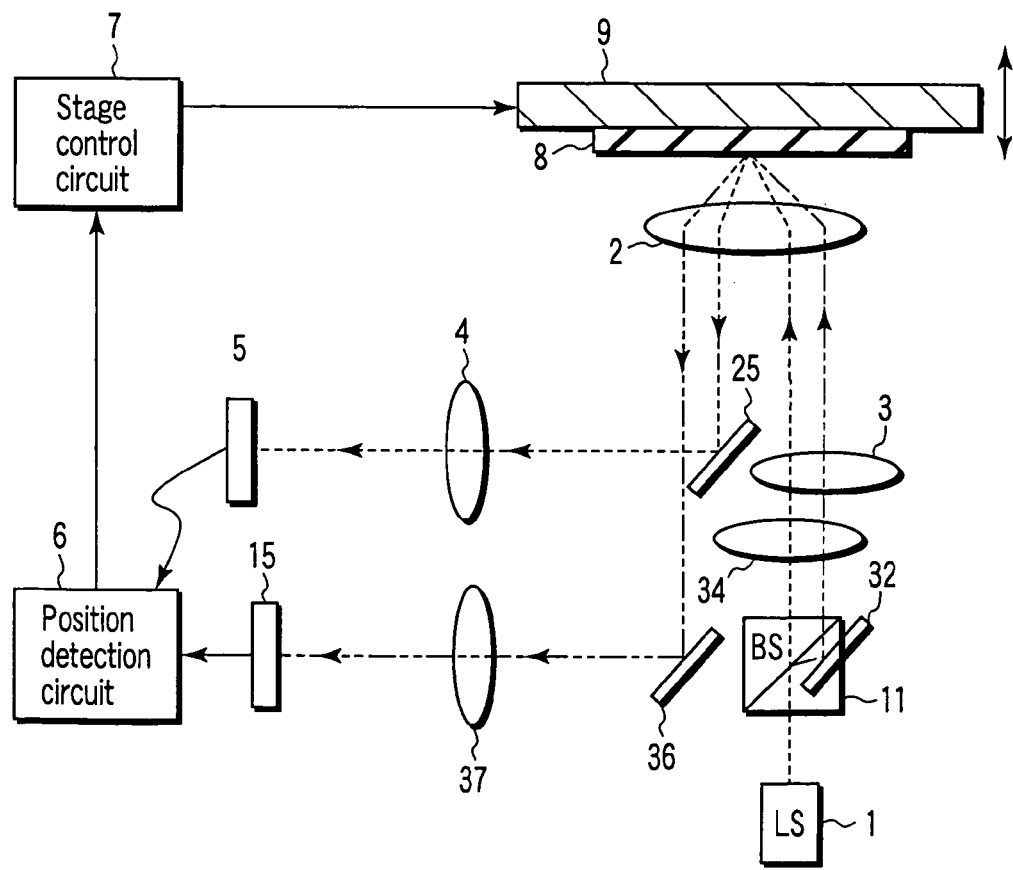
FIG. 11 is a schematic diagram of the automatic focusing apparatus according to a sixth embodiment.

FIG. 11 is a schematic diagram of the automatic focusing apparatus according to a sixth embodiment of the present invention based on this concept. It is to be noted that the same parts as those of FIG. 9 are denoted with the same reference numerals, and a detailed description is omitted.

A basic configuration is the same as that of the fifth embodiment shown in FIG. 9, and two position detecting mechanisms are different from each other not in an incident angle, but in an incident direction.

Also in this configuration, the detection signal of a sensor having a minimum spot position change of reflected light is selected. Accordingly, when the light beam is incident upon the fine pattern on the substrate 8, having the same degree of line width as that of the light source wavelength, a measurement error generated by the spot position change of reflected light can be suppressed. Thereafter, an advantage similar to that of the fifth embodiment is obtained.

(Seventh Embodiment)

Figure 12:
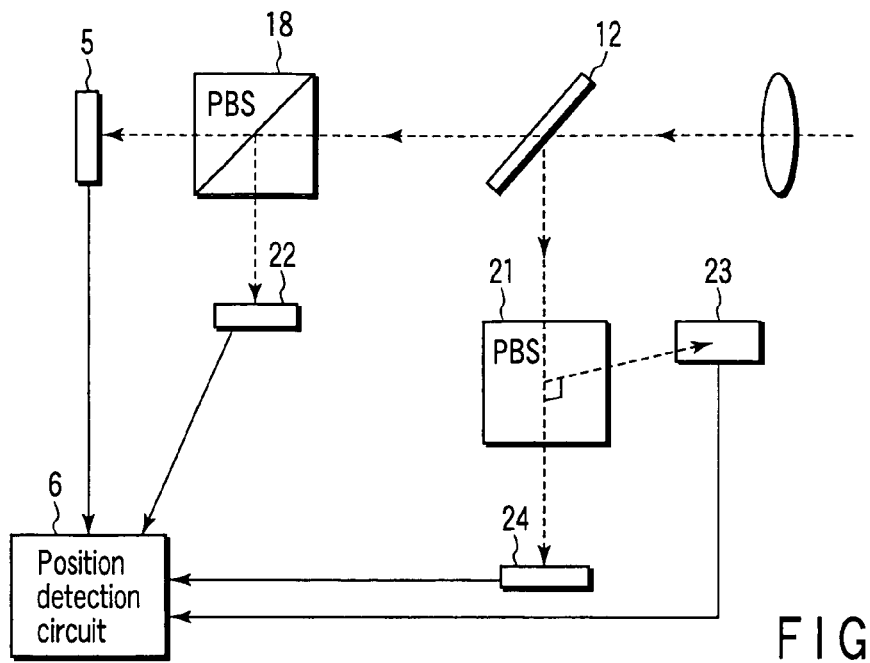
FIG. 12 is a diagram showing a basic configuration of the automatic focusing apparatus according to a seventh embodiment.

FIG. 12 is a diagram showing a basic configuration of the automatic focusing apparatus according to a seventh embodiment of the present invention. It is to be noted that the same parts as those of FIG. 3 are denoted with the same reference numerals, and a detailed description is omitted.

A value of the abnormal deviation of a spot position of reflected light from the surface of a substrate 8 changes according to the polarization component of reflected light. As shown in FIG. 12, the reflected light is separated by a beam splitter 12, each light beam is further separated by polarizing beam splitters 18, 21, and photosensors 5, 22, 23, 24 for the separated light beams are used. Two polarizing beam splitters 18, 21 respectively form two light beams whose polarization directions differ from each other by 90°, and the polarization directions of the light beams of the beam splitter 18 and the light beams of the beam splitter 21 differ from each other by 45°. The vertical deviation of the substrate 8 is equally reflected in the signals of the photosensors 5, 21, 22, 23. Therefore, when the signal having a minimum signal change is selected from the photosensors 5, 21, 22, 23, a signal having a minimum influence of the abnormal deviation of the spot position of reflected light is obtained. In this manner, the influence of the abnormal deviation of the reflected light spot position can be suppressed.

Figure 13:
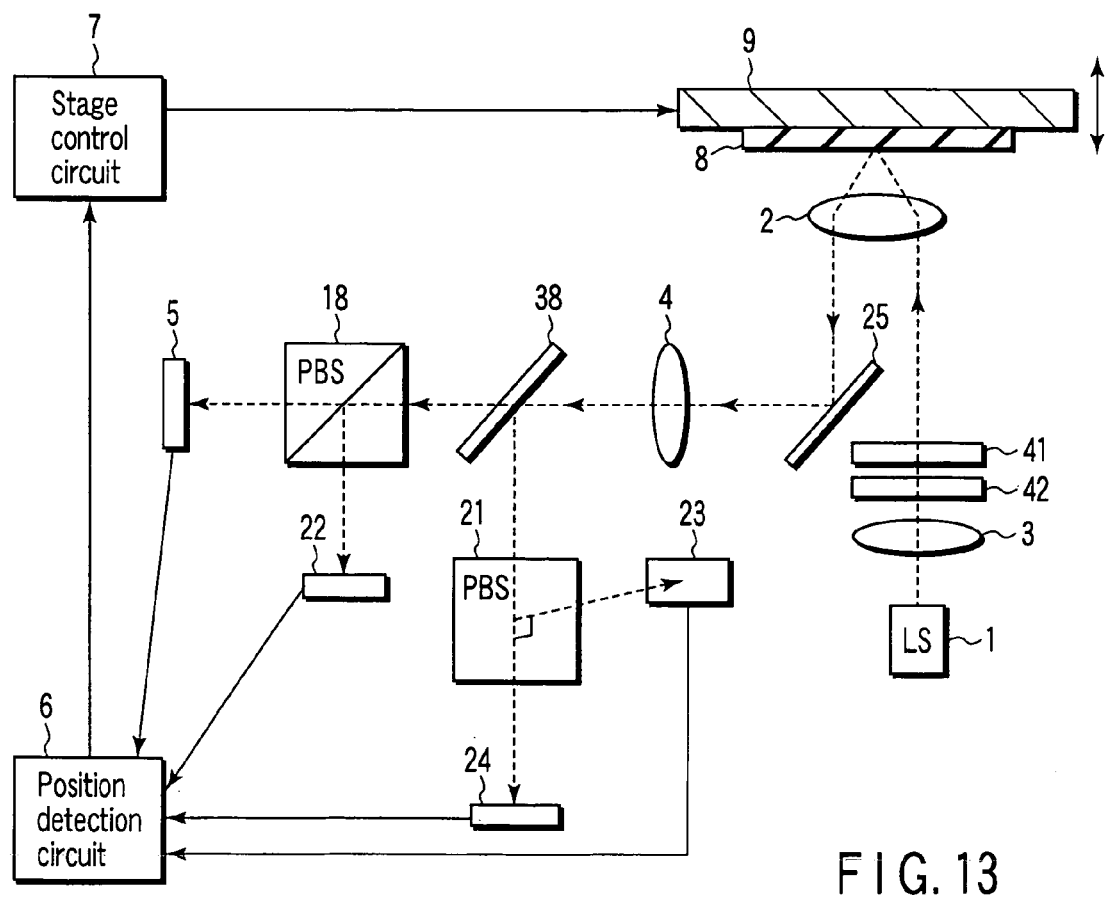
FIG. 13 is a schematic diagram of the automatic focusing apparatus according to the seventh embodiment.

FIG. 13 is a schematic diagram showing the above-described automatic focusing apparatus in further detail. It is to be noted that the same parts as those of FIG. 3 are denoted with the same reference numerals, and a detailed description is omitted.

A stage control mechanism comprises a stage control circuit 7 and a stage 9 in the same manner as in the first embodiment. A position detecting mechanism comprises a light source 1, objective lens 2, lens 3, wave plates 41, 42, mirror 25, lens 4, beam splitter 38, polarizing beam splitters 18, 21, photosensors 5, 22, 23, 24, and position detection circuit 6.

A light beam radiated from the light source 1 is obliquely incident upon the pattern surface of the substrate 8 via the lens 3, wave plates 41, 42, and objective lens 2 to form a spotted light source image. Each of the wave plates 41, 42 comprises a $\lambda/2$ plate and $\lambda/4$ plate, and is adjusted in such a manner that the polarization state during incidence upon the substrate 8 indicates a substantially circular polarization. The reflected light from the substrate 8 is formed into images on the photosensors 5, 22, 23, 24 via the objective lens 2, mirror 25, condenser lens 4, beam splitter 38, and polarizing beam splitters 18, 21.

Two polarizing beam splitters 18, 21 respectively form two light beams whose polarization directions are different from each other by 90° with respect to the reflected light from the substrate 8, and are disposed in such a manner that the polarization directions of the light beams of the beam splitter 18 and those of the beam splitter 21 differ from each other by 45°. More concretely, polarized light is detected at 0° by the photosensor 5, at 90° by the photosensor 22, at 45° by the photosensor 24, and at 135° by the photosensor 23. It is to be noted that in the present embodiment a line sensor is used as the photosensor, but a quadrature photodiode or the like may also be used.

The position detection circuit 6 selects one of the position signals with respect to the photosensors 5, 22, 23, 24. The input signals from the photosensors 5, 22, 23, 24 are compared, and a signal having a minimum change amount is selected and output to the stage control circuit 7. The photosensors 5, 22, 23, 24 receive light beams whose polarization directions differ every 45°. That is, an abnormal shift of a reflected light beam spot depends on the polarization direction of reflected light. Therefore, when the minimum signal change is selected, the signal having the least error can be taken out. By this configuration, the signal change by the abnormal deviation of the reflected light beam spot position is removed, and an automatic focusing operation can be normally performed.

As described above, according to the present embodiment, four light beams having different polarization directions are detected by independent photosensors, and the detection signal of a sensor having the minimum spot position change of reflected light beam is selected. Accordingly, when the light beam is incident upon the fine pattern on the substrate 8, having the same degree of line width as that of the light source wavelength, the measurement error generated by the spot position change of the reflected light can be suppressed. Therefore, an advantage similar to that of the first embodiment is obtained.

(Eighth Embodiment)

The spot shifting of the reflected light in the fine pattern described above with reference to FIGS. 1 and 2 is closely related to an angle $\phi$ formed by an incident direction of incident light and a direction of line pattern. When $\phi=0$, there is no repeated structure with respect to the incident direction, and therefore the spot of reflected light does not shift. With incident directions $\phi$ and $\phi+\pi$, the spot shifting amount is equal, and a shifting direction is reversed. Therefore, in the above-described condensing optics, a focal position does not change with a component of $\phi=0$, and the focal position changes with a $\phi=\pi/2$ component, and it is anticipated that astigmatism occurs. When a direction and a degree of astigmatism are measured, measurement of error occurrence and error reduction can be realized. When an area sensor is used as the photosensor in the present embodiment, it is possible to confirm a beam shape, and the measurement of astigmatism and the reduction of errors can be performed.

Figure 14:
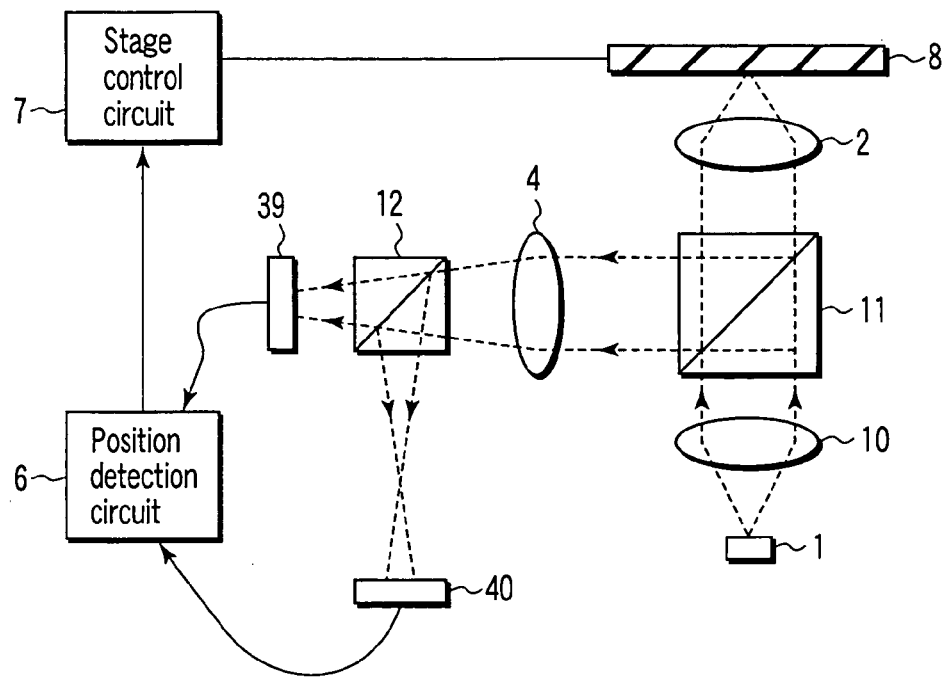
FIG. 14 is a schematic diagram of the automatic focusing apparatus according to an eighth embodiment.

FIG. 14 is a schematic diagram showing the automatic focusing apparatus according to an eighth embodiment of the present invention based on this concept. It is to be noted that the same parts as those of FIG. 3 are denoted with the same reference numerals, and a detailed description is omitted.

A laser diode, for example, having a wavelength of 600 to 700 nm is used as the light source 1. A light beam radiated from the light source 1 is collimated by a collimator lens 10, thereafter transmitted through the beam splitter 11, and converged onto the surface of the substrate 8 by the objective lens 2. The light beam reflected by the substrate 8 is transmitted through the objective lens 2 again, reflected by the beam splitter 11, and thereafter converged by the lens 4. The beam splitter 12 is disposed immediately after the lens 4, and the light beam is branched into two light paths. An area sensor (two-dimensional photosensor comprising CCD or the like) 39 is disposed before the focal point of the lens 4 in a first light path, and an area sensor 40 is disposed after the focal point of the lens 4 in a second light path. Sensor signals obtained by the area sensors 39, 40 are input into the position detection circuit 6. The position detection circuit 6 processes the input sensor signal, performs calculation by an algorithm described later, and thereafter outputs a vertical position signal of the substrate 8. The area sensor mentioned herein is, for example, a CCD, but is not limited to this. Any sensor which can output the intensity distribution of beams as electric signals may be used.

Figure 15:
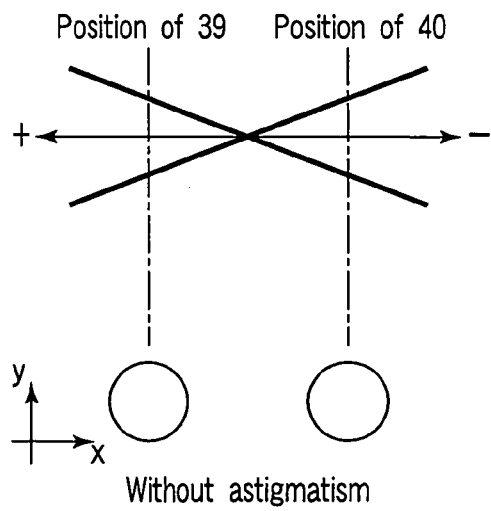
FIG. 15 is a diagram showing a position detection algorithm according to the eighth embodiment in a focused state without any astigmatism.
Figure 16:
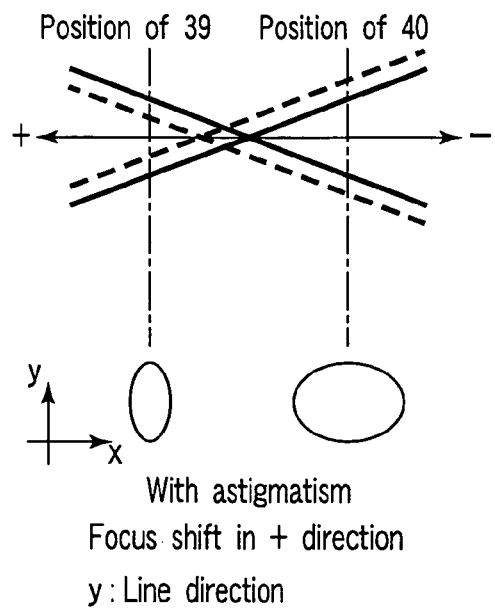
FIG. 16 is another diagram showing the position detection algorithm of the eighth embodiment in a case where a focal point deviates and astigmatism is caused.

The algorithm of position detection is based, for example, on the following principle. As shown in FIG. 15, when there is no astigmatism, and the focal position is positioned in the middle between the area sensors 39 and 40, the same beam shape is obtained from both the sensors. On the other hand, as shown in FIG. 16, when the beam spot shifts in the fine pattern, the focal point deviates in a direction perpendicular to a line direction of a line and space pattern, and therefore the beams obtained by the area sensors 39, 40 have an ellipse shape. Assuming that the line direction of the line and space pattern corresponds to y direction in FIG. 16 and the focal point deviates in a + direction in FIG. 16, the beam shape obtained by the area sensor 39 is an ellipse in which an x-direction is a minor axis, and the beam shape obtained by the area sensor 40 is an ellipse in which a y-direction is a minor axis. Since the focal point is assumed to deviate in the + direction, ellipticity of the beam shape obtained by the area sensor 39 is larger.

Therefore, the ellipticity of the beam shape. obtained by the area sensor 39 is compared with that by the area sensor 40, and it can be judged that a diameter in a major axis direction of the beam shape with a larger ellipticity does not include any error. Since the major axis direction of the beam shape obtained by the area sensor 39 is the y-direction, the y-direction diameter of the beam shape obtained by the area sensor 39 or 40 does not include any error, and a correct vertical position of the substrate can be obtained from the y-direction beam diameters of both the area sensors. In other words, the position is detected based on the diameter of the axial direction having a small change ratio.

In other words, recognition of a direction having no error is realized by comparison of ellipticities with respect to the beam shapes obtained by the area sensors 39, 40 in the above-described method. This is based on an assumption that the focal points of an condensing optics are beforehand positioned at the rear of the area sensors 39 and in front of the area sensor 40. Therefore, when a mechanism to vertically shift the vertical position of the substrate 8 is disposed, and a servo operation is performed based on the vertical position signal with respect to the mechanism, the recognition can be easily realized. That is, when the servo target value is set in such a manner that the beam diameters of the area sensor 39 becomes same as that of the area sensor 40, the state can be maintained.

A concrete flow of processing is, for example, as follows based on this principle. First, a position where it is known that there is no fine pattern on the substrate 8 is irradiated with light, and the signals obtained by two area sensors 39, 40 are taken into the position detection circuit 6. The position detection circuit 6 calculates a beam diameter in an optional direction, calculates a difference/sum of the beam diameters of the area sensors 39, 40, and starts the servo operation based on this value. Thereafter, the position detection circuit 6 constantly monitors ellipticities of the beam shapes obtained by the area sensors 39, 40. A certain threshold value is set to the ellipticity beforehand. When the ellipticity of one sensor image exceeds the threshold value, the position detection circuit 6 obtains a major diameter ϕ of the one sensor. Furthermore, the circuit calculates the beam diameter ϕ' of the other sensor in the major diameter ϕ direction, and calculates the difference/sum with respect to ϕ and ϕ', and outputs the value as a servo signal. Thereafter, the circuit compares the ellipticity of the area sensor 39 with that of the area sensor 40, calculates the beam diameter of the major diameter ϕ of one sensor having a larger ellipticity and the beam diameter ϕ' of the other sensor in the major diameter ϕ direction and outputs the difference/sum with respect to ϕ and ϕ' as the servo signal. This operation is continued.

As described above, according to the present embodiment, the reflected light from the substrate 8 is branched into two, one light beam is received before the focal point, the other light beam is received behind the focal point, and the position is detected by the same principle as that of a double pinhole method. Moreover, when the ellipticity of a sensor image exceeds the threshold value, the vertical position is detected based on the major diameter of the sensor image having a larger ellipticity. Accordingly, when the light beam is incident upon the fine pattern having the same degree of line width as that of the light source wavelength on the substrate 8, the measurement error caused by the spot position change of reflected light can be suppressed. Therefore, an advantage similar to that of the first embodiment is obtained.

It is to be noted that in the embodiments, an example of application to a pattern defect inspection system which inspects the pattern of the surface of the substrate has been described, but the present invention may also be applied to a lithography system in which the pattern is transferred to the surface of the substrate. Furthermore, the present invention may be applied to various systems in which the focusing with the objective lens is required. Optical components of each portion of the apparatus can be appropriately changed in accordance with specifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An automatic focusing apparatus, comprising:
a stage which holds a substrate and which is movable in a horizontal direction and a vertical direction;
an objective lens disposed facing a surface of the substrate;
first illumination optics which illuminate the surface of the substrate with at least one incident light beam from an oblique direction;
a first photodetector which detects light reflected from the surface of the substrate to output a first electric signal;
a first position detection circuit which detects a vertical position of the surface of the substrate from the first electric signal to output a first position detection signal;
a correction circuit which monitors the first position detection signal in real time and which subtracts a surplus signal change value exceeding a predetermined signal change value from the first position detection signal, when a difference between a change in the amount per unit time of the first position detection signal and a vertical position target value exceeds a first predetermined level, to output a corrected position signal; and
a stage control circuit which controls the vertical position of the stage based on the corrected position signal.

2. The automatic focusing apparatus according to claim 1, wherein the first photodetector is either a line sensor or a quadrature photodiode.

3. The automatic focusing apparatus according to claim 1, further comprising a second photodetector which detects a polarization component of a predetermined direction of the reflected light,
wherein the first position detection circuit detects the vertical position of the surface of the substrate from the electric signal obtained by the first photodetector, and
the correction circuit monitors the position detection signal in real time and outputs the corrected position signal, when the change amount per unit time of the first position detection signal with movement of the stage in the horizontal direction exceeds the first predetermined level and when intensity of the electric signal obtained by the second photodetector exceeds a second predetermined level.

4. The automatic focusing apparatus according to claim 1, further comprising:
- second illumination optics which illuminate a back surface of the substrate with incident light from an oblique direction;
- a second photodetector which detects reflected light from the back surface of the substrate to output a second electric signal; and
- a second position detection circuit which detects the vertical position of the back surface of the substrate from the second electric signal;

wherein:
the correction circuit monitors the first position detection signal and the second position detection signal, and outputs the corrected position signal, when the change amount per unit time of the first position detection signal with movement of the stage in the horizontal direction exceeds the first predetermined level and when a difference between the first and the second position detection signal exceed the third predetermined level.

5. The automatic focusing apparatus according to claim 4, wherein the first and the second photodetector are either line sensors or quadrature photodiodes.

6. The automatic focusing apparatus according to claim 1, further comprising:
- a first wave plate which is disposed in the first illumination optics to obtain circular polarization of the light beam incident upon the surface of the substrate from the oblique direction;
- a second wave plate which obtains linear polarization of the reflected light beam from the surface of the substrate;
- a polarizing beam splitter which divides the reflected light beam obtained through the second wave plate into a component along a linear polarization direction of the reflected light and a component crossing the linear polarization direction at a right angle; and
- a second photodetector which detects light of the component crossing the linear polarization direction of the reflected light at the right angle, to output a second electric signal;

wherein:
the first photodetector detects the light of the component along the linear polarization direction of the reflected light, and
the correction circuit monitors the first position detection signal in real time, and outputs the corrected position signal, when the change amount per unit time of the first position detection signal with movement of the stage in the horizontal direction exceeds the first predetermined level and when the second electric signal exceeds a predetermined value.

7. The automatic focusing apparatus according to claim 6, wherein the first and the second wave plate include a $\lambda/2$ plate and a $\lambda/4$ plate.

8. The automatic focusing apparatus according to claim 4, wherein the first photodetector is either a line sensor or a quadrature photodiode.

9. The automatic focusing apparatus according to claim 1, wherein the first illumination optics comprise a laser light source.

10. An automatic focusing apparatus comprising:
- a stage which holds a substrate and which is movable in a horizontal direction and a vertical direction;
- an objective lens disposed facing the surface of the substrate;
- illumination optics which illuminate the surface of the substrate with a plurality of incident light beams from an oblique direction at different incident angles or in different incident directions;
- a plurality of photodetectors which detect a plurality of reflected light beams from the surface of the substrate to output a plurality electric signals, the plurality of electric signals having a signal change amount;
- a position detection circuit which selects the electric signal having the smallest signal change amount to detect a vertical position of the surface of the substrate to output a position signal; and
- a stage control circuit which controls the vertical position of the stage based on the position signal.

11. The automatic focusing apparatus according to claim 10, further comprising a beam splitter which creates the plurality of incident light beams at different incident angles.

12. The automatic focusing apparatus according to claim 10, wherein the plurality of photodetectors are either line sensors or quadrature photodiodes.

13. The automatic focusing apparatus according to claim 10, wherein the illumination optics comprise a laser light source.

14. An automatic focusing apparatus comprising:
- a stage which holds a substrate and which is movable in a horizontal direction and a vertical direction;
- an objective lens disposed facing the surface of the substrate;
- illumination optics which illuminate the surface of the substrate with an incident light beam from an oblique direction;
- a wave plate which is disposed in the illumination optics to obtain a circular polarization of the light beam incident upon the surface of the substrate from the oblique direction;
- a beam splitter which divides light reflected from the surface of the substrate into two reflected beams in two directions;
- a first polarizing beam splitter which divides one of the two reflected beams into first and second light beams whose polarization directions cross each other at a right angle;
- a second polarizing beam splitter which divides the other of the two reflected beams into a third and a fourth light beam whose polarization directions cross each other at a right angle and whose polarization directions are different from those of the first and the second light beam by 45 degrees;
- a first photodetector which detects the first light beam to output a first electric signal having a first signal change amount;
- a second photodetector which detects the second light beam to output a second electric signal having a second signal change amount;
- a third photodetector which detects the third light beam to output a third electric signal having a third signal change amount;
- a fourth photodetector which detects the fourth light beam to output a fourth electric signal having a fourth signal change amount;
- a position detection circuit which receives the first to the fourth electric signal and which selects the electric signal having the smallest signal change amount to detect a vertical position of the surface of the substrate and output a position signal; and
- a stage control circuit which controls the vertical position of the stage based on the position signal.

15. The automatic focusing apparatus according to claim 14, wherein the first to the fourth photodetector are either line sensors or quadrature photodiodes.

16. The automatic focusing apparatus according to claim 14, wherein the illumination optics comprise a laser light source.

17. An automatic focusing apparatus comprising:
a stage which holds a substrate and which is movable in a horizontal direction and a vertical direction;
an objective lens disposed facing the surface of the substrate;
illumination optics which face the substrate via the objective lens;
a first beam splitter which transmits a light beam emitted from the illumination optics to irradiate the surface of the substrate with an incident light beam and receives a reflected light beam from the substrate to emit the reflected light beam out by reflection;
condensing optics which converge the reflected light beam emitted from the first beam splitter to output a converged beam;
a second beam splitter which divides the converged beam into first and second branched light beams in two directions;
a first area sensor which is disposed on a light path of the first branched light and before a focal position of the condensing optics to detect the first branched light and output a first electric signal;
a second area sensor which is disposed on a light path of the second branched light and behind the focal position of the condensing optics to detect the second branched light and output a second electric signal;
a position detection circuit which processes the first and the second electric signal to detect a vertical position of the substrate and output a position signal; and
a stage control circuit which controls the vertical position of the stage based on the position signal.

18. The automatic focusing apparatus according to claim 17, wherein the position detection circuit compares ellipticity of a beam shape obtained by the first area sensor with that by the second area sensor to detect the vertical position based on a major diameter of the beam shape having a larger ellipticity.

19. The automatic focusing apparatus according to claim 17, wherein the first and the second area sensor are CCD sensors.

20. The automatic focusing apparatus according to claim 17, wherein the illumination optics comprise a laser light source.

* * * * *